(12) United States Patent
Honda

(10) Patent No.: US 7,355,480 B2
(45) Date of Patent: Apr. 8, 2008

(54) BIAS CIRCUIT

(75) Inventor: Yuri Honda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 137 days.

(21) Appl. No.: 11/304,695

(22) Filed: Dec. 16, 2005

(65) Prior Publication Data
US 2006/0145765 A1    Jul. 6, 2006

(30) Foreign Application Priority Data
Jan. 6, 2005    (JP)    ............................ 2005-001376

(51) Int. Cl.
*H03F 3/04* (2006.01)
(52) U.S. Cl. ................ 330/296; 330/285; 330/289
(58) Field of Classification Search ................ 330/285, 330/289, 296
See application file for complete search history.

(56) References Cited
U.S. PATENT DOCUMENTS

| | | | |
|---|---|---|---|
| 6,492,869 B1 | 12/2002 | Kuriyama | .................... 330/133 |
| 6,806,775 B2 * | 10/2004 | Abe | ............................ 330/296 |
| 6,816,017 B2 * | 11/2004 | Yamashita et al. | ........... 330/298 |
| 6,946,913 B2 * | 9/2005 | Moriwaki et al. | ........... 330/296 |
| 7,009,453 B2 * | 3/2006 | Kuriyama | .................... 330/296 |
| 2002/0024390 A1 | 2/2002 | Yamashita et al. | |
| 2004/0056721 A1 | 3/2004 | Lesage et al. | |
| 2004/0189398 A1 | 9/2004 | Noh et al. | |
| 2004/0251967 A1 | 12/2004 | Moriwaki et al. | |

FOREIGN PATENT DOCUMENTS

| | | |
|---|---|---|
| JP | 2002-9558 | 1/2002 |
| WO | WO 03/105338 A1 | 12/2003 |

OTHER PUBLICATIONS

European Search Report dated Jun. 7, 2006 with English- Language Translation.

* cited by examiner

*Primary Examiner*—Khanh Van Nguyen
(74) *Attorney, Agent, or Firm*—McGinn IP Law Group, PLLC

(57) ABSTRACT

A bias circuit includes a voltage stabilizer connected between a control voltage input terminal through a current limit resistor and a ground, a bias supply emitter follower with a base connected to a node between the current limit resistor and the voltage stabilizer through a resistor, and a current limiter connected between the base and an emitter of the bias supply emitter follower.

8 Claims, 4 Drawing Sheets

BIAS CIRCUIT

BACKGROUND OF THE INVENTION

1. Field of the Invention

The present invention relates to bias circuits and, more particularly, to a bias circuit that is used for a high-frequency amplifier using a Hetero-junction Bipolar Transistor.

2. Description of Related Art

Recent wireless communication equipment such as a mobile phone have functions of internet connection and image transfer, and demand for high-speed transfer of large volume data is increasing. A power amplifier for transmission power amplification, which is used in a mobile phone or the like, uses a Hetero-junction Bipolar Transistor (HBT). The transmission power amplifier is required to have a low error rate for digital data, high power efficiency, high stability for control voltage variation, high stability for temperature variation and so on. A general approach to increase the stability for control voltage variation and the stability for temperature variation is to form a bias circuit on a semiconductor substrate. An example of the bias circuit is described in Japanese Unexamined Patent Publication No. 2002-9558. FIG. 4 shows the bias circuit described therein.

However, the present invention has recognized that the above bias circuit still fails to have sufficient stability for temperature variation due to a difference in the emitter size of temperature compensating transistors Q44 and Q45 and the emitter size of a bias supply transistor Q42 and an amplifier transistor Q41. Further, since a current flowing into the base of the amplifier transistor Q41 increases as a control voltage rises, a collector current of the amplifier transistor Q41 increases accordingly, which raises the heat of the amplifier transistor Q41. This can cause thermal runaway of the amplifier transistor.

SUMMARY OF THE INVENTION

According to an embodiment of the present invention, there is provided a bias circuit that includes a voltage stabilizer connected between a control voltage input terminal through a current limit resistor and a ground, a bias supply emitter follower with a base connected to a node between the current limit resistor and the voltage stabilizer through a resistor, and a current limiter connected between the base and an emitter of the bias supply emitter follower.

The bias circuit of the present invention allows reducing a bias current even when a control voltage of the bias circuit increases since a voltage stabilizer and a current limiter limit a collector current of a bias supply emitter follower. It is thereby possible to prevent thermal runaway of an amplifier transistor due to an increase in control voltage.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
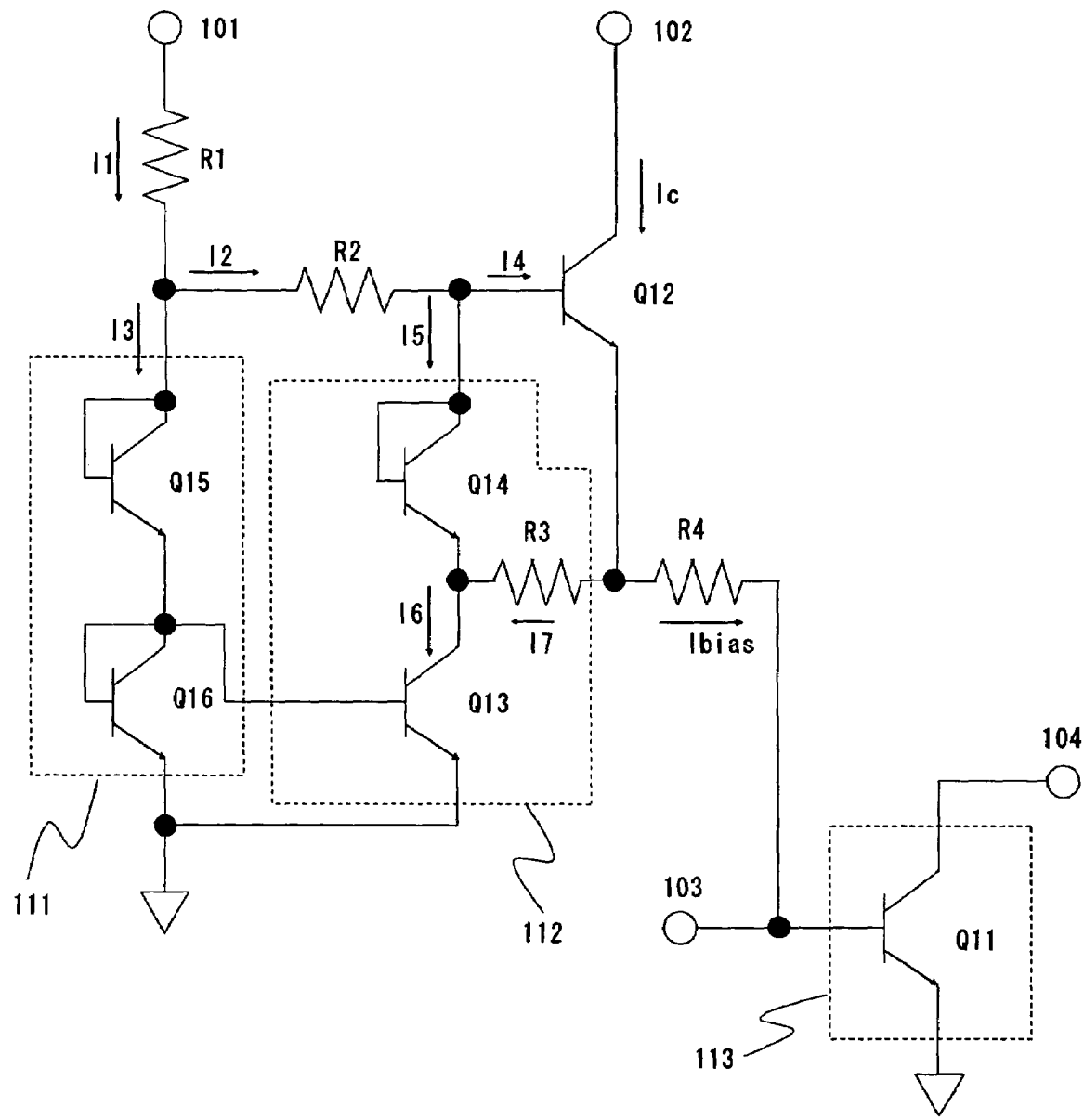
FIG. 1 is a circuit diagram of a bias circuit and a power amplifier according to a first embodiment of the present invention.

FIG. 1 shows a circuit diagram of a bias circuit and a transmission power amplifier according to a first embodiment of the invention. The bias circuit includes a control voltage input terminal 101, a current limit resistor R1, a voltage stabilizer 111, a resistor R2, a current limiter 112, a bias supply emitter follower Q12, and a bias resistor R4.

The voltage stabilizer 111 includes transistors Q15 and Q16. The current limiter 112 includes a resistor R3 and transistors Q13 and Q14.

The connection of components of the bias circuit is described hereinafter. The control voltage input terminal 101 is connected to one end of the current limit resistor R1. The other end of the current limit resistor R1 is connected to the collector of a first transistor (e.g. the transistor Q15) in the voltage stabilizer 111. The base and collector of the transistor Q15 are connected to each other and the emitter is connected to the collector of a second transistor (e.g. the transistor Q16). The base and collector of the transistor Q16 are connected to each other and the emitter is connected to the ground. The base of the transistor Q16 is connected to the base of the transistor Q13 of the current limiter 112.

The emitter of the transistor Q13 is connected to the ground, and the collector is connected to one end of the resistor R3. The other end of the resistor R3 is connected to the emitter of the bias supply emitter follower Q12. A node (Bias OUT) between the resistor R3 and the emitter follower Q12 is connected to the base terminal of an amplifier transistor Q11 through a bias resistor R4. The collector of the bias supply emitter follower Q12 is connected to a power supply 102.

The base and collector of the transistor Q14 are connected to each other and the collector is connected to the base of the bias supply emitter follower Q12. The emitter of the transistor Q14 is connected to a node between the resistor R3 and the transistor Q13.

One end of the resistor R2 is connected to a node between the current limit resistor R1 and the transistor Q15, and the other end is connected to the base of the emitter follower Q12.

The amplifier transistor Q11 serves as a power amplifier for transmission power amplification. The emitter of the amplifier transistor Q11 is connected to the ground. The base of the amplifier transistor Q11 is connected to a matching circuit (not shown), through which an input signal is supplied. The collector of the amplifier transistor Q11 is connected to a power supply through a coil (not shown), for example, and also connected to the matching circuit.

The operation of the bias circuit of the first embodiment is described hereinafter. Generally, a current Ic flowing through the collector and emitter of a bipolar transistor is determined based on a base current Ib that is applied to the base of the bipolar transistor. The current Ic has the characteristics that a larger current flows as a voltage difference between the emitter and collector is greater when a constant base current is applied.

If a predetermined voltage Vctr1 (for example, 2.85V) is input through the control voltage input terminal 101, a voltage that is a sum of a voltage between the base and emitter (VBE voltage) of the transistor Q15 and a VBE voltage of the transistor Q16 appears at a terminal of the current limit resistor R1 to the side of the transistor Q16. Thus, if the transistors Q15 and Q16 have the same level of VBE voltage, the voltage of 2 VBE appears. Flowing through the current limit resistor R1 is a current I1 that is obtained by dividing a result of subtraction of 2 VBE from Vctrl by the resistance value of R1. The current I1 is divided into a current I2 that flows to the current limiter 112 and a current I3 that flows to the voltage stabilizer 111. The current I2 is further divided into a current I4 that flows to the base of the bias supply emitter follower Q12 and a current I5 that flows to the transistor Q14. At this time, impedance of the base of the bias supply emitter follower Q12 is significantly higher than impedance from the transistor Q14 to the transistor Q13. Therefore, a large part of the current I2 flows into the transistor Q14 as the current I5. The current I4 is thus very low.

The transistor Q13 and the transistor Q16 form a current mirror. Therefore, the collector current I6 of the transistor Q13 and the current I3 of the voltage stabilizer 111 are substantially the same level. The current I6 equals a current that is a sum of the current I5 described above and a current I7 that is obtained by subtracting a bias current Ibias from a collector-emitter current Ic of the bias supply emitter follower Q12; thus, I6=I5+I7.

A difference in impedance value between the system where the current I2 flows and the system where the current I3 flows is equal to a resistance value of the resistor R2. Thus, the current I2 and the current I3 have substantially the same current value. Further, the current I6 is substantially equal to the current I3 and the current I5 is slightly lower than the current I2 as described above. Therefore, a difference between the current I6 and the current I5 is small, and the current I7 is a low current that compensates the difference.

Therefore, a large part of the current Ic of the bias supply emitter follower Q12 that is determined by the current limit resistor R1, the voltage stabilizer 111 and the current limiter 112 is supplied to the base of the amplifier transistor Q11 as a bias current Ibias.

Further, a base-emitter voltage of the bias supply emitter follower Q12 is set by a value of a sum of a voltage Vr3 obtained by multiplying the resistance of the resistor R3 with the current I7 and a VBE voltage of the transistor Q14. This voltage determines a degree of activity of the bias supply emitter follower Q12.

A case where the control voltage Vctrl increases by a small amount (about 0.1 V) is described hereinafter. As the control voltage Vctrl increases, a voltage difference between both ends of the current limit resistor R1 becomes greater and thus the current I1 increases. As the current I1 increases, the current I2, I3 and I6 increase accordingly. Due to an increase in the current I2, the current I4 that flows into the base of the bias supply emitter follower Q12 increases, and thereby the current Ic increases as well. If the current Ic increases, the current Ibias and the current I7 also increase. An increase in the current I7 causes the voltage Vr3 to be higher. At this time, the VBE voltage of the transistor Q14 hardly changes. Therefore, the base voltage of the bias supply emitter follower Q12 decreases and thus the VBE voltage of the bias supply emitter follower Q12 becomes lower. The degree of activity of the bias supply emitter follower Q12 is thus lowered and the current Ic decreases thereby. Upon reaching a predetermined current Ic based on the increased current by this operation, the circuit operation becomes stable. The current limiter 112 suppresses variation in the current Ibias to be supplied to the base of the transistor Q11 by the operation of the bias supply emitter follower Q12, the resistor R3 and the transistor Q14. Meanwhile, the current I2 that increases according to an increase in the control voltage Vctrl is bypassed through the transistor Q14 in the current limiter 112.

A case where the control voltage Vctrl increases by a large amount (about 0.7 V), on the other hand, is described hereinafter. As the control voltage Vctrl increases, a voltage difference between both ends of the current limit resistor R1 becomes still greater than in the above case, and thus the current I1 increases more significantly. As the current I1 increases, the current I2, I3 and I6 increase accordingly. At this time, an increase amount of the current I2 is bypassed as the current I5 that flows to the transistor Q14. On the other hand, an increase amount of the current I6 is greater than an increase amount of the current I5, which enlarges a difference between two current values. Since the current I7 increases thereby, a voltage Vr 3 that is obtained by multiplying the current I7 with the resistance of the resistor R3 increases. An increase in the voltage Vr causes the base voltage of the bias supply emitter follower Q12 to drop, thereby lowering the VBE voltage of the bias supply emitter follower Q12. The degree of activity of the bias supply emitter follower Q12 is thus lowered to be closer to the off-state. Hence, a current supply amount to the base of the amplifier transistor Q11 decreases asymptotically to zero.

Figure 2:
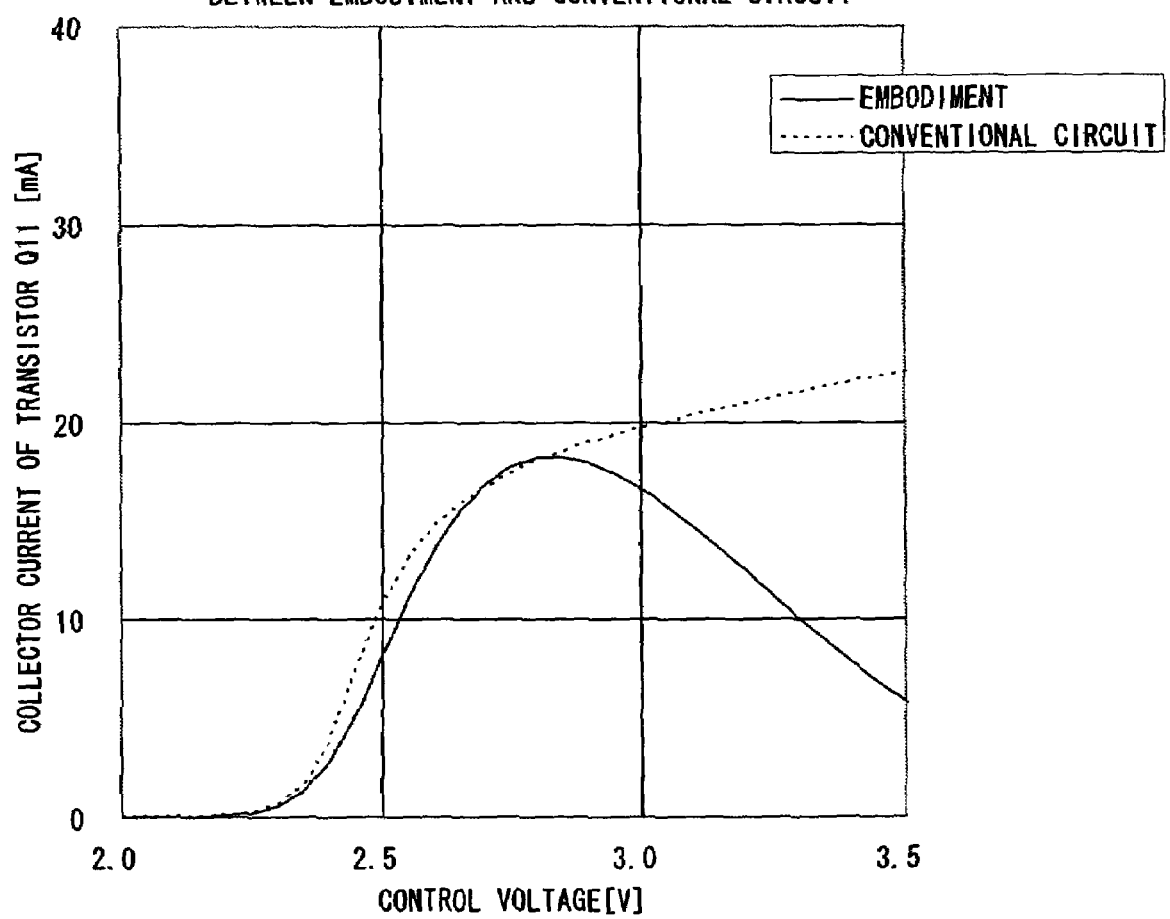
FIG. 2 is a graph to compare a change in collector current of an amplifier transistor due to a control voltage between a circuit according to an embodiment of the present invention and a circuit according to a conventional technique.

FIG. 2 shows the graph of the collector current of the amplifier transistor Q11 when the control voltage Vctrl varies. A change in the collector current of the amplifier transistor Q11 can be regarded as a current value that is amplified from a bias current supplied from the bias circuit to the amplifier transistor Q11. FIG. 2 tells that variation in bias current value of the bias circuit is small in the range of an actually used control voltage Vctrl (2.85±0.1 V).

A change in collector current of the amplifier transistor Q11 with temperature under a predetermined control voltage Vctrl (2.85 V) is described below. As temperature rises, a VBE voltage of a transistor generally decreases. For example, if a VBE voltage at normal temperature is 1.3 V, it becomes 1.26 V when temperature is higher. Further, since a resistor has a negative temperature coefficient, the resistance decreases as temperature rises. Thus, if temperature rises and a voltage generated in the voltage stabilizer 111 decreases, a voltage difference between both ends of the current limit resistor R1 becomes larger to reduce the resistance of the resistor R1. The current I1 thereby increases. As the current It increases, the current I2, I3 and I6 increase accordingly. Since the resistor R3 has a negative temperature coefficient, the resistance becomes smaller. The voltage Vr3 that is determined by the resistance of the resistor R3 and the current I7 thereby becomes lower. A VBE voltage of the bias supply emitter follower Q12 is determined by a sum of the transistor Q14 and the voltage Vr3. The VBE voltage of the bias supply emitter follower Q12 therefore decreases. Thus, the degree of activity of the bias supply emitter follower Q12 becomes smaller and the current Ic decreases thereby. Hence, the circuit operates so as to suppress variation in bias current Ibias to the amplifier transistor Q11 under temperature rise as well.

Figure 3:
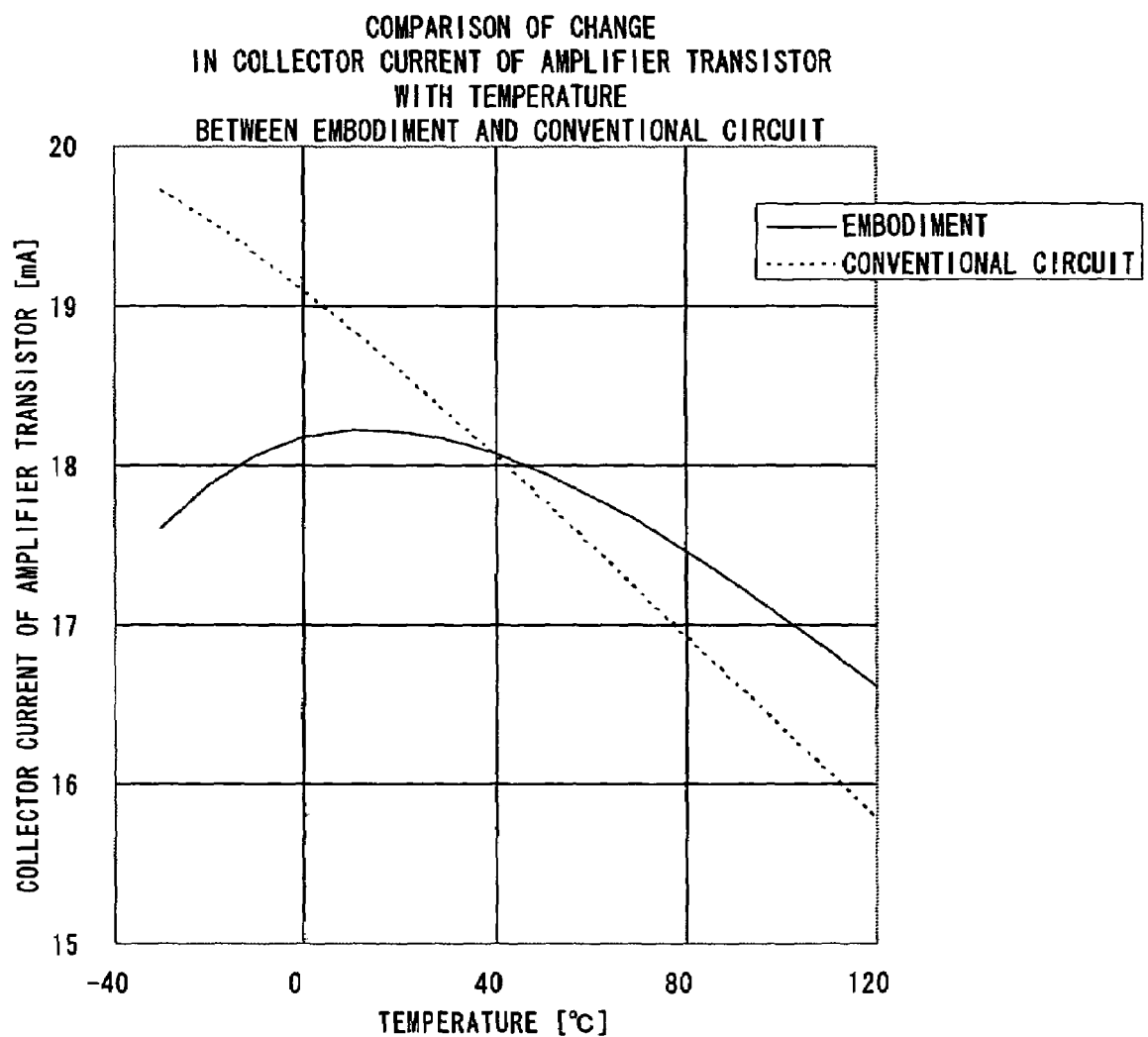
FIG. 3 is a graph to compare a change in collector current of an amplifier transistor due to temperature between a circuit according to an embodiment of the present invention and a circuit according to a conventional technique.
Figure 4:
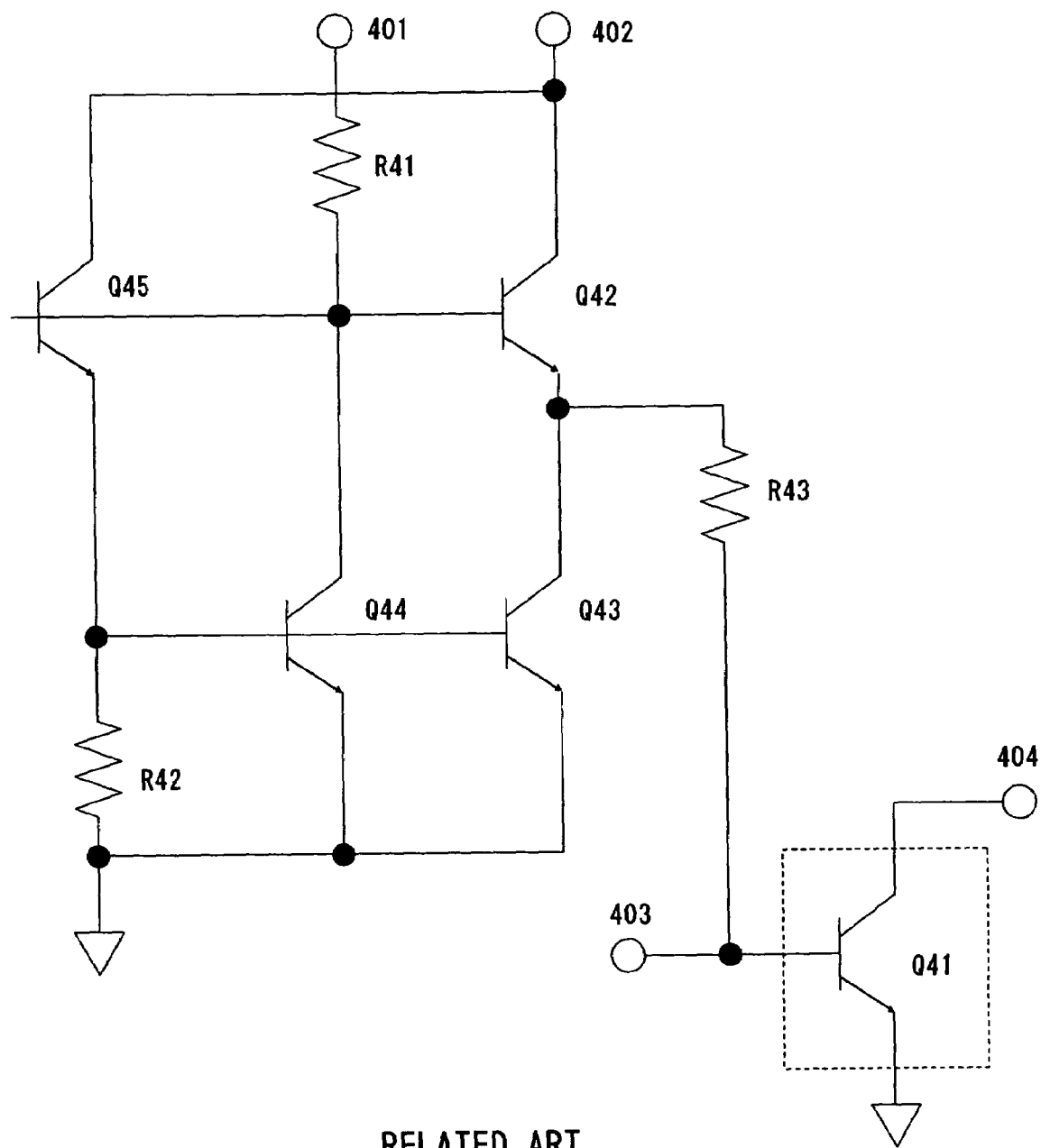
FIG. 4 is a circuit diagram of a bias circuit and a power amplifier disclosed in Japanese Unexamined Patent Publication No. 2002-9558.

FIG. 3 shows a graph of a change in collector current of the amplifier transistor Q11 when temperature varies. The change in collector current of the amplifier transistor can be regarded as a current value that is amplified from a bias current supplied from the bias circuit to the amplifier transistor. FIG. 3 tells that variation in bias current value of the bias circuit is small in a large temperature range (from −30° C. to 120° C.).

As described in the foregoing, the bias circuit of the first embodiment allows suppressing variation in the bias current Ibias with respect to variation in a control voltage Vctrl (for example, 2.85±0.1V) normally in use by the operation of the current limiter 112 of the bias circuit. The current limiter 112 can further suppress variation in the bias current Ibias with respect to variation in temperature also in the same operation as when the control voltage Vctrl varies. The current limiter 112 operates so that the bias current approaches zero when the control voltage Vctrl increases beyond a prescribed value. It is thereby possible to prevent thermal runaway of the amplifier transistor Q11 due to the bias current that increases as the control voltage Vctrl increases.

The present invention is not limited to the above described embodiments but may be varied in many ways. For example, use of a current instead of a voltage as a control signal also allows implementation of the bias circuit described above.

It is apparent that the present invention is not limited to the above embodiment that may be modified and changed without departing from the scope and spirit of the invention.

What is claimed is:

1. A bias circuit comprising:
    a voltage stabilizer connected between a control voltage input terminal through a current limit resistor and a ground;
    a bias supply emitter follower with a base connected to a node between the current limit resistor and the voltage stabilizer through a resistor; and
    a current limiter connected between the base and an emitter of the bias supply emitter follower, wherein the current limiter comprises:
        a current source having a current value that varies according to a voltage value input through the control voltage input terminal;
        a transistor connected between the base of the bias supply emitter follower and the current source and having a base and a collector electrically connected to each other; and
        a resistor connected between a node between the transistor and the current source and the emitter of the bias supply emitter follower.

2. The bias circuit according to claim 1, wherein a base-emitter voltage of the bias supply emitter follower is set by the current limiter.

3. The bias circuit according to claim 1, wherein a current flowing to the current source of the current limiter is substantially the same as a current flowing to the voltage stabilizer.

4. The bias circuit according to claim 1, wherein the voltage stabilizer generates a voltage that is set based on a threshold voltage of a power amplifier transistor connected to the bias circuit and a threshold voltage of the bias supply emitter follower.

5. The bias circuit according to claim 1, wherein the voltage stabilizer generates a voltage that is set based on a voltage that is generated based on temperature characteristics of a threshold voltage of a power amplifier transistor connected to the bias circuit and temperature characteristics of a threshold voltage of the bias supply emitter follower.

6. The bias circuit according to claim 1, wherein the bias circuit is connected to an input terminal of a power amplifier transistor.

7. The bias circuit according to claim 1, wherein the voltage stabilizer comprises a diode-connected transistor, and
    the current limiter is controlled by a collector voltage of the diode-connected transistor.

8. The bias circuit according to claim 7, wherein the current limiter comprises a current source transistor, and
    the current source transistor and the diode-connected transistor form a current mirror.

* * * * *